(12) United States Patent
Takehira et al.

(10) Patent No.: US 11,963,459 B2
(45) Date of Patent: Apr. 16, 2024

(54) SWITCHING DEVICE AND RESISTANCE VARIABLE DEVICE

(71) Applicant: Kioxia Corporation, Tokyo (JP)

(72) Inventors: Hiroshi Takehira, Yokkaichi Mie (JP); Katsuyoshi Komatsu, Yokkaichi Mie (JP); Tadaomi Daibou, Yokkaichi Mie (JP); Hiroki Kawai, Inazawa Aichi (JP); Yuichi Ito, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 426 days.

(21) Appl. No.: 17/469,778

(22) Filed: Sep. 8, 2021

(65) Prior Publication Data

US 2022/0093851 A1    Mar. 24, 2022

(30) Foreign Application Priority Data

Sep. 18, 2020   (JP) .................. 2020-157380

(51) Int. Cl.
| | |
|---|---|
| *H01L 21/00* | (2006.01) |
| *G11C 11/16* | (2006.01) |
| *G11C 19/08* | (2006.01) |
| *H10N 50/10* | (2023.01) |
| *H10N 50/80* | (2023.01) |
| *H10N 50/85* | (2023.01) |
| *H10B 61/00* | (2023.01) |

(52) U.S. Cl.
CPC ........... *H10N 50/10* (2023.02); *G11C 11/161* (2013.01); *G11C 19/0841* (2013.01); *H10N 50/80* (2023.02); *H10N 50/85* (2023.02); *H10B 61/00* (2023.02)

(58) Field of Classification Search
CPC .............................. H10N 50/10; H10N 50/80
See application file for complete search history.

(56) References Cited

U.S. PATENT DOCUMENTS

| 7,737,527 B2 * | 6/2010 | Kang ................. G11C 13/0004 |
| | | 257/E27.047 |
| 10,304,509 B2 | 5/2019 | Yoshikawa et al. |
| 2015/0207066 A1 | 7/2015 | Ohba et al. |
| 2016/0336378 A1 | 11/2016 | Ohba et al. |
| 2017/0098684 A1 | 4/2017 | Ohba et al. |
| 2020/0075072 A1 | 3/2020 | Nagase et al. |
| 2020/0090775 A1 | 3/2020 | Ueda |

(Continued)

*Primary Examiner* — Douglas M Menz
(74) *Attorney, Agent, or Firm* — Holtz, Holtz & Volek PC

(57) ABSTRACT

A switching device according to an embodiment includes a switching layer disposed between a first electrode and a second electrode. The switching layer contains a material containing a first cation element Z, Te, and N. This material contains at least 5 atomic % or more of each of Z, Te, and N, and when an atomic ratio of Te is X, an atomic ratio of N is Y, an atomic ratio of Z is W, a ratio of $Z_2Te_3$ to ZN on a straight line connecting a compound of the first cation element Z with tellurium and nitride of the first cation element Z in a ternary phase diagram of Z, Te, and N is A, and a change in an N content from the $Z_2Te_3$—ZN line is B, the material has a composition satisfying X=1.2 (1−A)(0.5+B), Y=A (0.5+B), and W=1−X−Y, where −0.06≤B≤0.06 is satisfied when ⅓>A and ¾<A, and −0.06≤B and Y≤0.45 are satisfied when ⅓≤A≤¾.

10 Claims, 3 Drawing Sheets

(56) References Cited

U.S. PATENT DOCUMENTS

| | | |
|---|---|---|
| 2020/0091227 A1 | 3/2020 | Wayama et al. |
| 2020/0091411 A1 | 3/2020 | Sonoda |
| 2022/0238602 A1* | 7/2022 | Shimuta ............... H10N 70/826 |

* cited by examiner

SWITCHING DEVICE AND RESISTANCE VARIABLE DEVICE

CROSS REFERENCE TO RELATED APPLICATIONS

This application is based upon and claims the benefit of priority from Japanese Patent Application No. 2020-157380, filed on Sep. 18, 2020; the entire contents of which are incorporated herein by reference.

FIELD

Embodiments disclosed herein relate generally to a switching device and a resistance variable device.

BACKGROUND

A resistance variable device having a switching layer and a resistance variable layer as a nonvolatile memory layer is used in a semiconductor memory device. In such a resistance variable device, a switching device having the switching layer is used to switch on/off current to the resistance variable layer, or the like.

DETAILED DESCRIPTION

A switching device according to an embodiment includes: a first electrode; a second electrode; and a switching layer disposed between the first electrode and the second electrode. In the switching device of the embodiment, the switching layer contains a material containing a first cation element Z, tellurium, and nitrogen, wherein the material contains 5 atomic % or more of each of the first cation element Z, tellurium, and nitrogen, and when an atomic ratio of tellurium is X, an atomic ratio of nitrogen is Y, an atomic ratio of the first cation element Z is W, a ratio of $Z_2Te_3$ to ZN on a straight line connecting a compound of the first cation element Z with tellurium and nitride of the first cation element Z in a ternary phase diagram of the first cation element Z, tellurium, and nitrogen is A, and a change amount in the atomic ratio of nitrogen from the straight line connecting $Z_2Te_3$ and ZN in the ternary phase diagram is B, the material has a composition satisfying:

$X = 1.2(1-A)(0.5+B)$  General equation 1:

$Y = A(0.5+B)$  General equation 2:

$W = 1-X-Y$  General equation 3:

where $-0.06 \leq B \leq 0.06$ is satisfied when $\frac{1}{3} > A$ and $\frac{3}{4} < A$, and $-0.06 \leq B$ and $Y \leq 0.45$ are satisfied when $\frac{1}{3} \leq A \leq \frac{3}{4}$.

Hereinafter, a switching device of an embodiment will be explained with reference to the drawings. In each embodiment, substantially the same components are denoted by the same codes, and a description thereof is sometimes partially omitted. The drawings are schematic, and a relationship between a thickness and a planar size, thickness proportions of the respective portions, and the like are sometimes different from actual ones.

Figure 1:
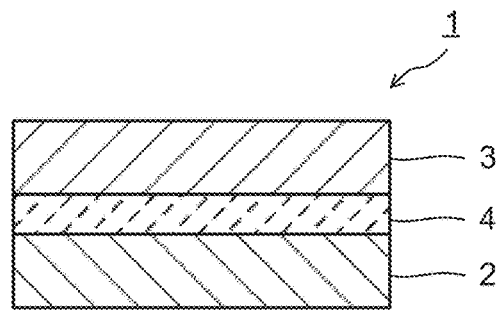
FIG. 1 is a cross-sectional diagram illustrating a basic configuration of a switching device according to an embodiment.

FIG. 1 is a cross-sectional view illustrating a basic configuration of a switching device 1 of an embodiment. The switching device 1 illustrated in FIG. 1 includes a first electrode 2, a second electrode 3, and a switching layer 4 disposed between the first electrode 2 and the second electrode 3. The switching layer 4 has a function of switching on and off current flowing between the first electrode 2 and the second electrode 3. The switching layer 4 has electric properties to be in an off-state with a high resistance value when a voltage of less than a threshold value (Vth) is applied, and rapidly transferring from the off-state with the high resistance value to an on-state with a low resistance value when a voltage of the threshold value (Vth) or more is applied.

That is, when the voltage applied to the switching layer 4 is less than the threshold value (Vth), the switching layer 4 functions as an insulator and blocks the current flowing into a functional layer such as a resistance variable layer added to the switching layer 4, thereby turning the functional layer off. When the voltage applied to the switching layer 4 is the threshold value (Vth) or more, the resistance value of the switching layer 4 drops rapidly and functions as a conductor, allowing the current to flow through the switching layer 4 to the functional layer. The switching device 1 having the switching layer 4 is applied, for example, to control the on/off of the current to the functional layer in various electronic devices.

Figure 2:
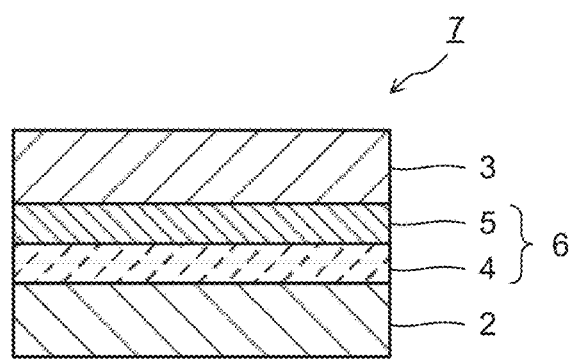
FIG. 2 is a cross-sectional diagram illustrating a basic configuration of a resistance variable device using the switching device according to the embodiment.

The switching device 1 illustrated in FIG. 1 is applied to a resistance variable device 7, where a stacked film 6 of the switching layer 4 and a resistance variable layer 5 that functions as a nonvolatile memory layer is disposed between the first electrode 2 and the second electrode 3, as illustrated in FIG. 2, for example. The resistance variable layer 5 is electrically connected to the switching layer 4. The stacked film 6 in the resistance variable device 7 is not limited to a structure where the switching layer 4 and the resistance variable layer 5 are directly stacked, but may also be a structure where other layers such as an intermediate layer or an additional layer are interposed therebetween, or a structure where the intermediate layer, the additional layer, or the like is interposed between the first electrode 2 and the switching layer 4 or between the resistance variable layer 5 and the second electrode 3.

Figure 3:
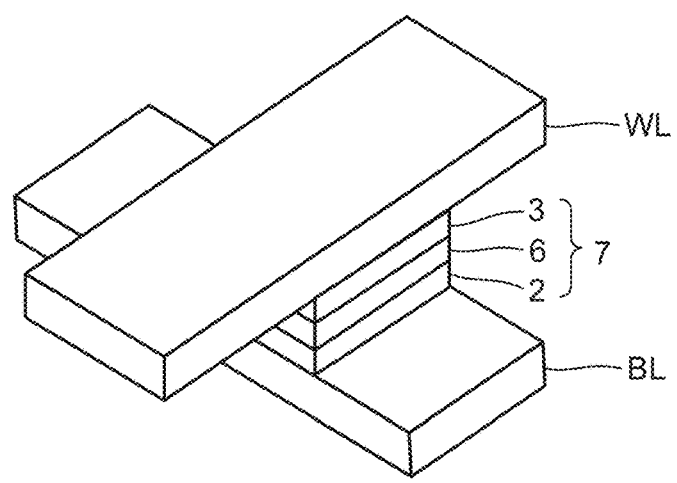
FIG. 3 is a perspective diagram illustrating the resistance variable device illustrated in FIG. 2.

As illustrated in FIG. 3, for example, the resistance variable device 7 is disposed at an intersection of a bit line BL and a word line WL to function as a memory cell. Although FIG. 3 illustrates only the intersection of one bit line BL and one word line WL, in reality, a cross-point type semiconductor memory device is configured where the resistance variable device 7 as the memory cell is disposed at each intersection of many bit lines BL and word lines WL. A form where a second resistance variable device and a second bit line BL are further stacked on the word line WL is also possible. In other words, a structure where the word line WL and the bit line BL are alternately stacked and the resistance variable device is disposed at their intersection, and the number of layers is one or more is also possible.

A memory layer in a resistance variable-type memory is used for the resistance variable layer 5. Examples of the resistance variable-type memory include a resistive random access memory (ReRAM), a phase change memory (PCM), a magnetoresistive random access memory (MRAM), and others. The memory layer of each of these various resistance variable-type memories is used as the resistance variable layer 5. The resistance variable layer 5 is not limited to a single layer structure but may be a multilayer film necessary to perform functions of each memory. The switching device 1 is not limited to the resistance variable device 7 but is used for switching various electronic devices.

In the resistance variable device 7 illustrated in FIG. 2 and FIG. 3, the switching layer (selector layer) 4 is electrically connected to the resistance variable layer 5 and has a function of switching the current to the resistance variable layer 5 on and off. When the voltage applied to the switching layer 4 is lower than the threshold value (Vth), the switching layer 4 functions as the insulator, blocking the current flowing to the resistance variable layer 5 and turning the resistance variable layer 5 off. When the voltage applied to the switching layer 4 exceeds the threshold value (Vth), the resistance value of the switching layer 4 suddenly decreases and functions as the conductor, allowing the current to flow through the switching layer 4 to the resistance variable layer 5, enabling a write or read operation of the resistance variable layer 5. The switching device 1 has the function of switching on/off the resistance variable layer 5 as the memory layer in the resistance variable device 7 that functions as the resistance variable-type memory.

In the switching device 1 described above, the switching layer 4 contains a material containing a first cation element Z, tellurium (Te), and nitrogen (N) (hereinafter referred to as a switching material). In obtaining the function (on/off switching function) of the switching layer 4 described above, the first cation element Z is preferably a cation element that forms a compound with Te represented by $Z_2Te_3$ (compound of the first cation element Z with tellurium). The first cation element Z is preferably at least one element selected from a group consisting of aluminum (Al), gallium (Ga), indium (In), antimony (Sb), and bismuth (Bi). All of these cation elements are known to form the $Z_2Te_3$ compounds, such as $Al_2Te_3$, $Ga_2Te_3$, $In_2Te_3$, $Sb_2Te_3$, and $Bi_2Te_3$.

The switching material containing the first cation element Z, Te, and N used for the switching layer 4 (hereinafter also referred to as a Z—Te—N material) contains 5 atomic % or more of each of the first cation element Z, Te, and N, and when an atomic ratio of Te is X, an atomic ratio of N is Y, an atomic ratio of the first cation element Z is W, a ratio of $Z_2Te_3$ (the compound of the first cation element Z with tellurium) to ZN (nitride of the first cation element Z) on a straight line connecting $Z_2Te_3$ and ZN in a ternary phase diagram of the first cation element Z, Te, and N is A, and a change amount in the atomic ratio of nitrogen from the straight line connecting $Z_2Te_3$ and ZN in the ternary phase diagram is B, the switching material has a composition satisfying:

$X=1.2(1-A)(0.5+B)$   General equation 1:

$Y=A(0.5+B)$   General equation 2:

$W=1-X-Y$   General equation 3:

where $-0.06 \leq B \leq 0.06$ is satisfied when $\frac{1}{3}>A$ and $\frac{3}{4}<A$, and $-0.06 \leq B$ and $Y \leq 0.45$ are satisfied when $\frac{1}{3} \leq A \leq \frac{3}{4}$.

This composition will be described in detail later. The Z—Te—N material indicates a material that contains the cation element Z, Te, and N, but the ratio of these elements is not specified.

The switching layer 4 that contains the switching material containing the above-stated first cation element Z and Te, which form the $Z_2Te_3$ compound, and N exhibits a property of transferring between the high-resistance state and the low-resistance state (switching property) based on the voltage threshold (Vth). The switching material forms, for example, a mixed compound of $Z_2Te_3$ and ZN (for example, AlN, GaN, InN, SbN, BiN, and the like). However, the switching material is not limited to Z—Te—N compounds that explicitly form $Z_2Te_3$ and ZN, but for example, some elements may form compounds other than $Z_2Te_3$ and ZN, some elements may exist in an amorphous state, and some elements may even form homopolar bonds such as Z—Z, Te—Te, and N—N. One example of a mechanism for the switching property can be attributed to an electrical conduction mechanism through localized states in a band gap due to an amorphous structure. Therefore, the switching layer 4 may include the amorphous structure.

In the switching device 1 used in electronic devices such as stacked memory devices like the resistance variable device illustrated in FIG. 2 and FIG. 3, it is desirable to suppress a sneak current that causes, for example, read failures, that is, when a voltage V is applied to one of the memory cells disposed in a matrix, for example, the sneak current equivalent to ½ V flows to an adjacent cell. For this purpose, the switching device 1 is required to have a low OFF current and a high ON/OFF ratio. To reduce the leakage current in the switching device 1 having the switching layer 4 containing the Z—Te—N material described above, it is effective to reduce the homopolar bonds such as Z—Z, Te—Te, and N—N. This makes it possible to reduce the leakage current of the switching device 1.

Figure 4:
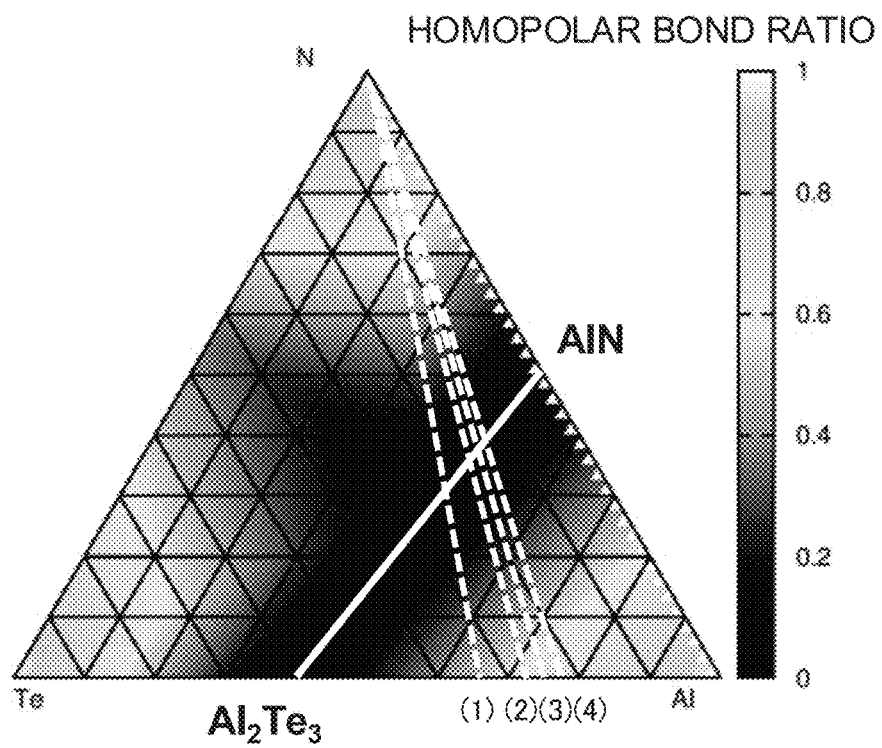
FIG. 4 is a diagram presenting a homopolar bond ratio in a ternary phase diagram of an Al—Te—N material used for the switching device according to the embodiment.
Figure 5:
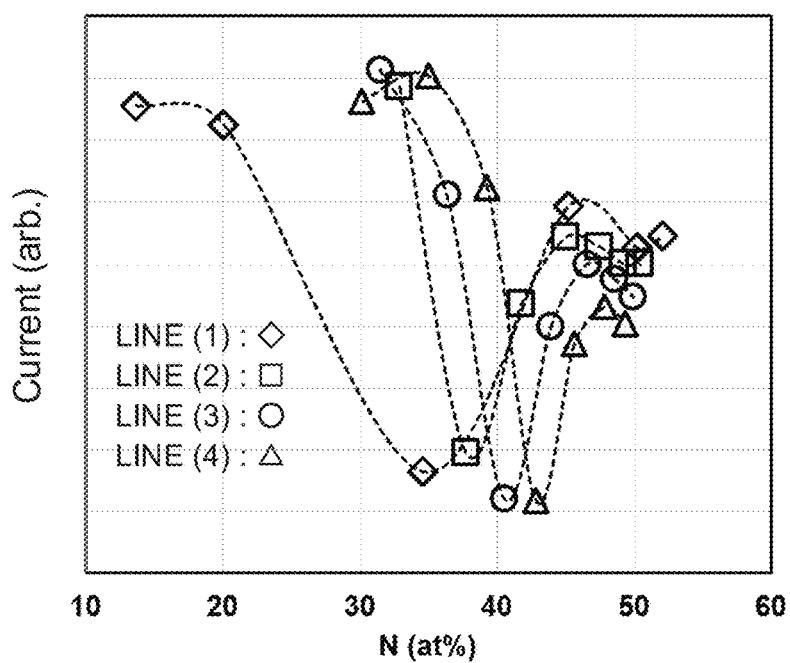
FIG. 5 is a diagram illustrating a leakage current when a nitrogen content of an Al—Te—N compound on the ternary phase diagram presented in FIG. 4 is varied.

When the switching layer 4 containing the Z—Te—N material is applied, compositions on the line connecting $Z_2Te_3$ and ZN ($Z_2Te_3$—ZN line) in the ternary phase diagram of the Z—Te—N material has the lowest homopolar bond ratio, and the low leakage current can be expected. FIG. 4 presents a ternary phase diagram of an Al—Te—N material using Al as a representative example of the first cation element Z. FIG. 4 illustrates the homopolar bond ratio in a gray scale. In the ternary phase diagram of the Z—Te—N material presented in FIG. 4, compositions on a line connecting $Al_2Te_3$ and AlN ($Al_2Te_3$—AlN line) have the minimum homopolar bond ratio. FIG. 5 illustrates measurement results of the leakage currents when a nitrogen content is varied on lines (1), (2), (3), and (4) starting from a simple substance of nitrogen that intersects the $Al_2Te_3$—AlN line in the ternary phase diagram of the Al—Te—N material presented in FIG. 4. FIG. 5 is a graph illustrating a change in the leakage current when the nitrogen content is varied.

As illustrated in FIG. 5, it can be seen that there is a composition having the minimum leakage current on the $Al_2Te_3$—AlN line where the homopolar bond ratio is the minimum. Therefore, the leakage current of the switching layer 4 can be minimized by applying the switching layer 4 containing the Al—Te—N material with such a composition. This is not limited to the Al—Te—N material, but similar properties are expected for each of the Z—Te—N materials containing Ga, In, Sb, Bi, or the like, which forms the tellurium compound and the nitride compound similar to Al. To enhance practicality of the switching device 1, it is desirable to have a small leakage current. Therefore, a range of the homopolar bond ratio is preferably about 0.2, where a current value shows the minimum and the small leakage current can be expected, as illustrated in FIG. 5. From such a homopolar ratio, the N content is preferably in a range of ±6 atomic % for the B value, which indicates the range of the N content from on the $Z_2Te_3$—ZN line.

Figure 6:
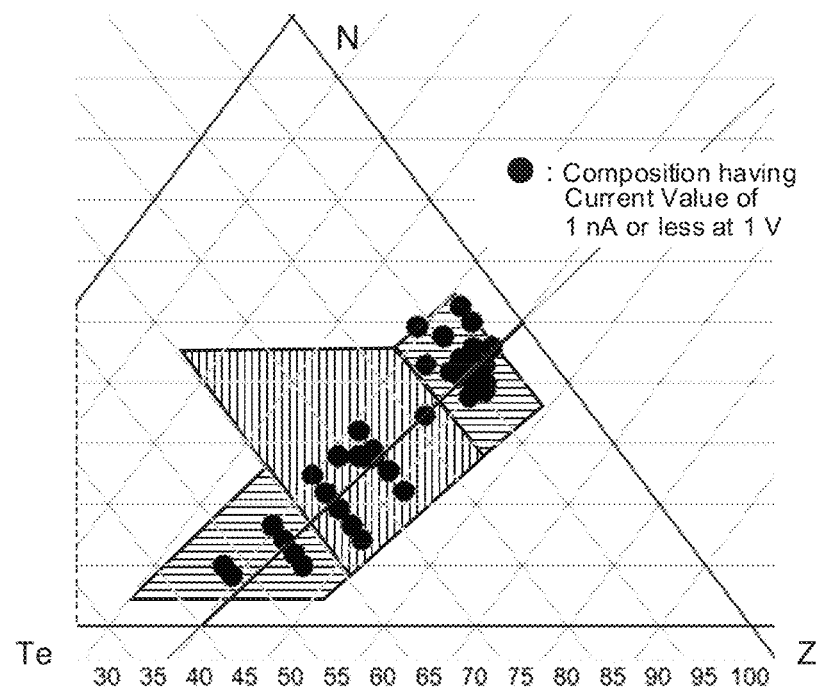
FIG. 6 is a diagram presenting a composition range in a ternary phase diagram of a Z—Te—N compound used for the switching device according to the embodiment.

To satisfy the homopolar range of about 0.2 as described above, it is preferable to satisfy the composition of the Z—Te—N material as described above. Specifically, it is preferable to have the composition represented by a shaded region in the ternary phase diagram of the Z—Te—N material presented in FIG. 6. In other words, the atomic ratios of Z, Te, and N in the composition of the Z—Te—N material are each preferably 5 atomic % or more. When the atomic ratios of Z, Te, and N are each less than 5 atomic %, either a content of $Z_2Te_3$ or a content of ZN will be too large, and the $Z_2Te_3$—ZN line in the ternary phase diagram presented in FIG. 6 becomes too close to a Z—Te composition line or a Z—N composition line, and the effect of reducing the leakage current based on the $Z_2Te_3$—ZN composition cannot be sufficiently obtained.

Further, the composition of the Z—Te—N material preferably satisfies conditions described below when the atomic ratio of Te is X, the atomic ratio of N is Y, the atomic ratio of Z is W, the ratio of $Z_2Te_3$ to ZN on the $Z_2Te_3$—ZN line in the Z—Te—N ternary phase diagram is A, and the change in the N content from the $Z_2Te_3$—ZN line is B. Here, when the value A is 0, the composition becomes $Z_2Te_3$, and when the value A is 1, the composition becomes ZN. The composition of the Z—Te—N material satisfies:

$X=1.2(1-A)(0.5+B)$  General equation 1:

$Y=A(0.5+B)$  General equation 2:

$W=1-X-Y$  General equation 3:

where $-0.06 \leq B \leq 0.06$ is preferably satisfied when $\frac{1}{3} > A$ and $\frac{3}{4} < A$, and $-0.06 \leq B$ and $Y \leq 0.45$ are preferably satisfied when $\frac{1}{3} \leq A \leq \frac{3}{4}$. By using the Z—Te—N material satisfying such a composition, the leakage current when a voltage of 1 V is applied to the switching device 1 can be reduced to about 1 nA or less, and the properties of the switching device 1 can be enhanced.

The switching layer 4 containing the Z—Te—N material described above may further contain at least one element selected from a group consisting of boron (B), carbon (C), and phosphorus (P). Containing these elements (B, C, P) can increase durability and heat resistance of the switching layer 4, and can also contribute to lowering the leakage current. However, when a content of elements such as B, C, and P becomes too high, the original properties of the Z—Te—N material may be impaired. For this reason, the content of B, C, and P in the Z—Te—N material is preferably 10 atomic % or less.

Constituent materials of the electrodes 2 and 3 in direct or indirect contact with the switching layer 4 are not particularly limited, but include, for example, a TiN film, a TiN/Ti stacked film, a C/TiN/Ti stacked film, a W film, a C/W/TiN stacked film, and the like. In addition to these, metal electrodes made of W alloy, Cu, Cu alloy, Al, Al alloy, and the like, which are used as electrodes in various semiconductor elements, may be applied to the electrodes 2 and 3.

For example, sputtering and vapor deposition methods can be applied to form the switching layer 4 containing the Z—Te—N material. For example, the switching layer 4 can be formed using a Z—Te—N target whose composition has been adjusted. The Z—Te—N material layer can also be obtained by using a target made of a Z—Te material and exposing the target to a nitrogen atmosphere during or after the formation of a Z—Te film. The Z—Te—N material layer can also be obtained by alternately stacking Z films and Te films and exposing the stacked film to the nitrogen atmosphere during or after film formation. The deposition method of the Z—Te—N material layer is not particularly limited.

In the switching device 1 of the embodiment, the switching layer 4 is formed by the Z—Te—N material having the composition described above or the material to which B, C, P, and the like are added, and based on such a switching layer 4, good switching properties (properties of transferring between the high resistance state and the low resistance state based on the voltage threshold (Vth)) can be obtained, and the leakage current, including the sneak current to adjacent cells, can be reduced. Therefore, it is possible to provide the switching device 1 with excellent properties and practicality.

While certain embodiments have been described, these embodiments have been presented by way of example only, and are not intended to limit the scope of the inventions. Indeed, those embodiments may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A switching device, comprising: a first electrode; a second electrode; and a switching layer disposed between the first electrode and the second electrode, wherein
    the switching layer contains a material containing a first cation element Z, tellurium, and nitrogen, wherein
    the material contains 5 atomic % or more of each of the first cation element Z, tellurium, and nitrogen, and
    when an atomic ratio of tellurium is X, an atomic ratio of nitrogen is Y, an atomic ratio of the first cation element Z is W, a ratio of $Z_2Te_3$ to ZN on a straight line connecting a compound of the first cation element Z with tellurium and nitride of the first cation element Z in a ternary phase diagram of the first cation element Z, tellurium, and nitrogen is A, and a change amount in the atomic ratio of nitrogen from the straight line connecting $Z_2Te_3$ and ZN in the ternary phase diagram is B, the material has a composition satisfying:

$X=1.2(1-A)(0.5+B)$  General equation 1:

$Y=A(0.5+B)$  General equation 2:

$W=1-X-Y$  General equation 3:

where $-0.06 \leq B \leq 0.06$ is satisfied when $\frac{1}{3} > A$ and $\frac{3}{4} < A$, and $-0.06 \leq B$ and $Y \leq 0.45$ are satisfied when $\frac{1}{3} \leq A \leq \frac{3}{4}$.

2. The switching device according to claim 1, wherein the first cation element Z contains at least one selected from a group consisting of aluminum, gallium, indium, antimony, and bismuth.

3. The switching device according to claim 1, wherein the first cation element Z contains aluminum.

4. The switching device according to claim 1, wherein the material further contains at least one selected from a group consisting of boron, carbon, and phosphorus.

5. The switching device according to claim 1, wherein the material further contains at least one selected from a group consisting of boron, carbon, and phosphorus in a range of 10 atomic % or less.

6. The switching device according to claim 1, wherein at least part of the switching layer has an amorphous structure.

7. A resistance variable device, comprising:
the switching device according to claim 1; and
a resistance variable layer electrically connected to the switching layer of the switching device.

8. The resistance variable device according to claim 7, wherein
the first cation element Z contains at least one selected from a group consisting of aluminum, gallium, indium, antimony, and bismuth.

9. The resistance variable device according to claim 7, wherein
the first cation element Z contains aluminum.

10. The resistance variable device according to claim 7, wherein
the material further contains at least one selected from a group consisting of boron, carbon, and phosphorus.

* * * * *